United States Patent
Itano et al.

(10) Patent No.: US 7,139,028 B2
(45) Date of Patent: Nov. 21, 2006

(54) IMAGE PICKUP APPARATUS

(75) Inventors: Tetsuya Itano, Kanagawa (JP);
Hidekazu Takahashi, Kanagawa (JP);
Tomoyuki Noda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 705 days.

(21) Appl. No.: 09/976,096

(22) Filed: Oct. 15, 2001

(65) Prior Publication Data
US 2002/0051071 A1   May 2, 2002

(30) Foreign Application Priority Data
Oct. 17, 2000   (JP)   ............... 2000-316646
Nov. 6, 2000    (JP)   ............... 2000-337900

(51) Int. Cl.
*H04N 5/335*   (2006.01)
*H04N 3/14*    (2006.01)

(52) U.S. Cl. ..................... 348/340; 348/302

(58) Field of Classification Search ............ 348/340, 348/335, 336, 342, 308, 272, 294, 315, 302; 257/E27.132, E27.134, 432; 438/70; 359/619; 250/208.1
See application file for complete search history.

(56) References Cited

U.S. PATENT DOCUMENTS

| | | | |
|---|---|---|---|
| 4,538,108 A * | 8/1985 | Huschelrath et al. | 324/232 |
| 5,179,480 A | 1/1993 | Takahashi | 360/78.04 |
| 5,262,871 A * | 11/1993 | Wilder et al. | 348/308 |
| 5,926,283 A | 7/1999 | Hopkins | 356/419 |
| 5,949,483 A * | 9/1999 | Fossum et al. | 348/315 |
| 5,982,497 A | 11/1999 | Hopkins | |
| 6,133,062 A | 10/2000 | Pai et al. | 438/70 |
| 6,137,535 A * | 10/2000 | Meyers | 250/208.1 |
| 6,171,885 B1 * | 1/2001 | Fan et al. | 257/E27.132 |
| 6,251,700 B1 | 6/2001 | Lin et al. | |
| 6,337,713 B1 * | 1/2002 | Sato | 348/320 |
| 6,665,010 B1 * | 12/2003 | Morris et al. | 348/308 |
| 6,765,617 B1 * | 7/2004 | Tangen et al. | 348/340 |
| 2002/0176037 A1 * | 11/2002 | Li | 349/95 |
| 2003/0133029 A1 * | 7/2003 | Booth, Jr. | 348/294 |

FOREIGN PATENT DOCUMENTS

| | | |
|---|---|---|
| EP | 0 926 885 | 6/1999 |
| JP | 9-148550 | 6/1997 |
| JP | 9-232551 | 9/1997 |
| JP | 11-330444 | 11/1999 |
| JP | 2000-9925 | 1/2000 |
| KR | 2003-0066464 | 1/2004 |

OTHER PUBLICATIONS

Official Communication from Korean Patent Office dated Jun. 14, 2004 (with Japanese Translation), and English translation of portion designated by asterisk('*').

(Continued)

*Primary Examiner*—Aung Moe
(74) *Attorney, Agent, or Firm*—Fitzpatrick, Cella, Harper & Scinto

(57) ABSTRACT

There is provided an image pickup apparatus in which a plurality of pixel areas in which pixels each having a photoelectric conversion unit are arranged two-dimensionally, are arranged on a single semiconductor chip to be adjacent to each other through a predetermined space, and a plurality of microlenses are formed on the plurality of pixels areas and on the predetermined spaces between the plurality of pixel areas.

6 Claims, 15 Drawing Sheets

OTHER PUBLICATIONS

Official Communication from Korean Patent Office dated Jun. 14, 2004 (with reporting letter from Korean Agent to Applicant (Japanese)).
Office Action, European Patent Office, dated Sep. 25, 2003.
Office Action, China Patent Office, dated Aug. 22, 2003.
European Search Report dated Apr. 22, 2003 (Ref. No. 2790830).
EPO Official Communication dated Feb. 15, 2002 (ref. No. 2790830).
Chinese Search Report issued in application No. 2004100036264 on Jun. 24, 2005.

* cited by examiner

FIG. 7
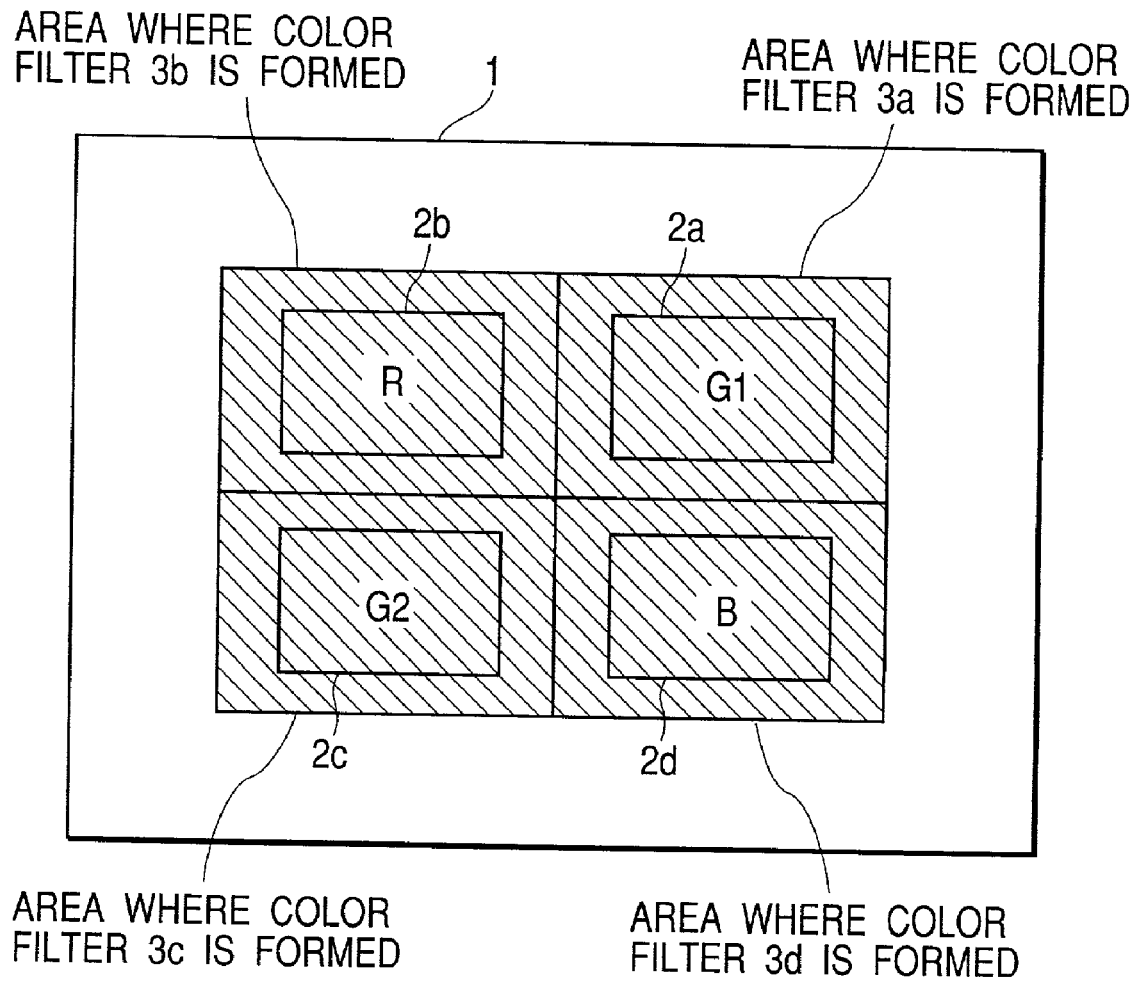
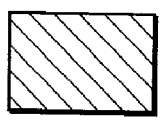 AREA 4 WHERE MICROLENS IS FORMED
 AREA 3 WHERE COLOR FILTER IS FORMED

IMAGE PICKUP APPARATUS

BACKGROUND OF THE INVENTION

1. Field of the Invention

The present invention relates to an image pickup apparatus for picking up an object image.

2. Related Background Art

FIG. 1 shows an example of the arrangement of a conventional solid-state image pickup element in which pixels having photoelectric conversion units are arranged two-dimensionally. Referring to FIG. 1, a pixel 101 has a photoelectric conversion unit such as a photodiode. A pixel area 100 for picking up an object image is formed by arranging such pixels two-dimensionally.

A signal from a pixel is output to a vertical signal line 103. A holding capacitor 104 temporarily stores the signal output to the vertical signal line 103. A transfer MOS transistor 105 transfers the signal output to the vertical signal line 103 to the holding capacitor 104. A transfer MOS transistor 106 transfers a signal from the holding capacitor 104 to a horizontal signal line 107.

A vertical scanning circuit 108 performs control to read out signals from pixels on each line to the vertical signal line by sequentially scanning pixels one line at a time in the horizontal direction. A horizontal scanning circuit 109 sequentially reads out signals from the holding capacitor 104 to the horizontal signal line 107 by controlling the transfer MOS transistor 106. A reset MOS transistor 110 resets the horizontal signal line. A constant output current source 107 forms a source follower together with the transistor included in the pixel.

The arrangement of color filters of the conventional solid-state image pickup element will be described below. FIG. 2 shows an example of this arrangement, which includes a first color filter 201 that transmits red light, a second color filter 202 that transmits green light, and a third color filter 203 that transmits blue light. In correspondence with the respective pixels arranged two-dimensionally, the first and second color filters are alternately arranged for odd-numbered columns starting from the first column, and the second and third color filters are alternately arranged for even-numbered columns starting from the second column. The second color filters are arranged so as not be adjacent to each other in the horizontal direction in odd- and even-numbered columns.

In general, as shown in FIG. 3, microlenses corresponding to the respective pixels are used to increase the sensitivity of the solid-state image pickup element. FIG. 3 shows a sectional structure of a unit pixel of the solid-state image pickup element on which microlenses are formed. A unit pixel 300 (corresponding to one pixel 101 in FIG. 1 is comprised of a photoelectric conversion unit 301, insulating layer 302, interconnection layers 303 and 304, light-shielding layer 305, passivation layer 306, planarizing layers 307 and 309, color filter layer 308, and microlens 310. Each microlens has a diameter a and a thickness b. This microlens improves the focusing efficiency of incident light to realize high sensitivity.

A general method of manufacturing a microlens will be described next with reference to FIG. 4. The upper layer of a color filter layer 408 is coated with a transparent resin 409 to planarize the surface. The resultant surface is then coated with a microlens material 410 made of an organic resin. The microlens material is patterned by exposure with a mask. Each pattern has a size a'. The microlens material has a thickness b'. As shown in FIG. 4, spaces 411 for isolating the microlenses are formed by development. The resultant structure is fluidized and solidified by heat treatment, thus forming desired microlenses.

As described above, according to the conventional solid-state image pickup element, a plurality of color filters are arranged in the pixel 101, as shown in FIG. 2.

According to this method, however, in a solid-state image pickup element having 640 (horizontal) pixels×480 (vertical) pixels with a pixel pitch of 10 μm, the focal length of each lens for providing a standard field angle is 8 mm, which is equal to the width across corner of the solid-state image pickup element.

If, therefore, an image pickup apparatus such as a digital camera is to be manufactured by using such solid-state image pickup elements, a reduction in thickness of the apparatus is undesirably limited.

A conventional solid-state image pickup element is available, in which microlenses are formed to respective pixels having photodiodes and formed on a single chip, light from an object is focused onto the photodiodes through the respective microlenses, and output signals from the respective pixels are processed by an image processing unit, thereby forming an image.

FIG. 5 is a sectional view showing peripheral portions of a photodiode and microlens of a conventional CCD image pickup element. FIG. 6 shows a substrate 21 made of silicon or the like, a photodiode 22 formed on the substrate 21, an oxide layer 29 formed on the substrate 21 on which the photodiode 22 is formed, a three-layer interconnection 23 made of polysilicon, to which a clock signal for transferring charge converted by the photodiode 22 is transmitted, a light-shielding layer 24 made of tungsten or the like, which mainly shields a charge transfer vertical CCD register $V_{CCD}$ formed blow the interconnection 23 against light, a first passivation layer 25 made of $SiO_2$ or the like and a second passivation layer 30 made of an SiON-based material or the like, which protect the photodiode 22 and the like against the open air ($O_2$, $H_2O$) and impurity ions ($K^+$, $Na^+$) and the like, a planarizing layer 26 made of an organic material and serving to reduce recesses/projections on the second passivation layer 30, and a microlens 27 formed on the planarizing layer 26 and serving to focus light from an object onto the photodiode 22.

In the solid-state image pickup element shown in FIG. 5, the photodiode 22 is formed on the substrate 21 by ion implantation or the like, and the three-layer interconnection 23 is formed with a dielectric interlayer. The light-shielding layer 24 is also formed with the dielectric interlayer. In this case, the light-shielding layer 24 is formed so as to cover the interconnection 23 to prevent light from striking the vertical CCD register $V_{CCD}$. Subsequently, the first passivation layer 25 is formed on the light-shielding layer 24 to protect the photodiode 22 against the open air and moisture. The second passivation layer 30 is then formed on the first passivation layer 25. Since recesses/projections with a level difference of about 7,000 Å are formed on the second passivation layer 30 in accordance with the shape of the light-shielding layer 24, the planarizing layer 26 is formed to reduce the recesses/projections. More specifically, the upper surface of the second passivation layer 30 is coated with an organic material, and the organic material is planarized by reflowing with heat, thereby forming the planarizing layer 26 with a thickness of about 1 μm with respect to a projection of the second passivation layer 30.

The distance between the upper surface of the planarizing layer 26 formed in this manner and the upper surface of the photodiode 22 is about 4 to 6 μm. The microlens 27 is then formed on the planarizing layer 26, thus manufacturing a solid-state image pickup element like the one shown in FIG. 5.

FIG. 6 is a sectional view showing peripheral portions of a photodiode and microlens of a MOS image pickup element. Referring to FIG. 6, a floating diffusion area 32 is a transfer destination for charge converted by the photodiode 22, a transfer gate 31 controls the transfer of the charge converted by the photodiode 22, and a selective oxide layer 33 is formed for isolation from an adjacent image pickup element.

The same reference numerals as in FIG. 5 denote the same parts in FIG. 6. In this element, a single-layer interconnection 23 is formed, and a light-shielding layer 24 is made of aluminum. The solid-state image pickup element is manufactured by the same procedure as that for the element shown in FIG. 5.

According to the conventional CCD image pickup element, however, the distance from the upper surface of the light-shielding layer to the upper surface of the oxide layer is as large as about 7,000 Å. If, therefore, light is obliquely incident on the microlens, the light is focused on the light-shielding layer instead of the photodiode in some case. If the light is not focused on the photodiode by the microlens, the photosensitivity of the photodiode may deteriorate or light shading may occur.

The conventional MOS image pickup element is larger in pixel size than the CCD image pickup element, and hence allows an increase in the width of one side of a photodiode. Even if, therefore, light is obliquely incident on the microlens, the light is focused on the photodiode. However, with the recent demands for a reduction in the size of pixels of a CMOS sensor, photodiodes smaller in size than conventional ones are being formed. More specifically, the length of each side of a photodiode has been reduced from about 3 μm to 1.5 μm. With a reduction in photodiode size, as in the CCD image pickup element, light is focused on the light-shielding layer by the microlens. This may lead to a deterioration in the photosensitivity of the photodiode and the occurrence of light shading.

SUMMARY OF THE INVENTION

It is the first object of the present invention to provide an image pickup apparatus that allows a reduction in its thickness.

In order to achieve the above object, according to one scope of the present invention, there is provided an image pickup apparatus comprising a plurality of pixel areas arranged on a single semiconductor chip to be adjacent to each other through a predetermined space, each of the pixel areas having pixels arranged two-dimensionally, each pixel having a photoelectric conversion unit, and a plurality of microlenses for forming light into images, wherein the plurality of microlenses are formed on the plurality of pixels areas and also on the predetermined spaces between the plurality of pixel areas.

It is the second object of the present invention to prevent a deterioration in the photosensitivity of a photoelectric conversion unit and the occurrence of light shading.

In order to achieve the above object, according to another scope of the present invention, there is provided an image pickup apparatus comprising a photoelectric conversion area for converting light into charge, a passivation layer for protecting the photoelectric conversion area, and a microlens formed in contact with the passivation layer, for focusing incident light onto the photoelectric conversion area, wherein a surface of the passivation layer is planarized, and the microlens is formed on the planarized surface.

The above and other objects, features, and advantages of the present invention will be apparent from the following detailed description in conjunction with the accompanying drawings and the appended claims.

BRIEF DESCRIPTION OF THE DRAWINGS

FIG. 7 is a view schematically showing a solid-state image pickup element according to the first embodiment of the present invention;

DESCRIPTION OF THE PREFERRED EMBODIMENTS

FIG. 7 is a schematic view showing a solid-state image pickup element according to the first embodiment of the present invention.

A solid-state image pickup element 1 is formed on a single semiconductor chip by a CMOS process or the like and has the following arrangement.

Figure 5:
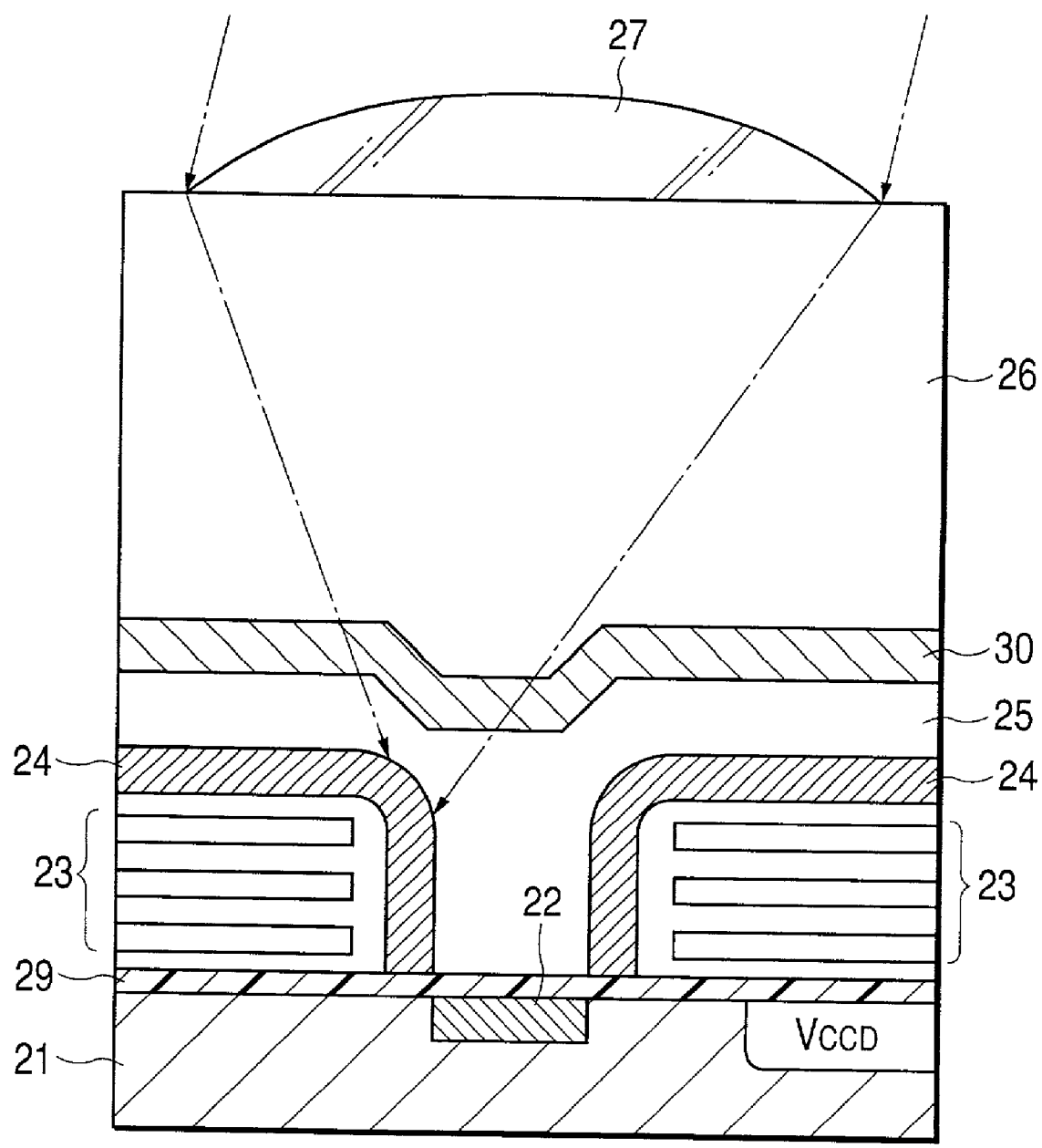
FIG. 5 is a sectional view showing peripheral portions of a photodiode and microlens of a conventional CCD image pickup element.
Figure 6:
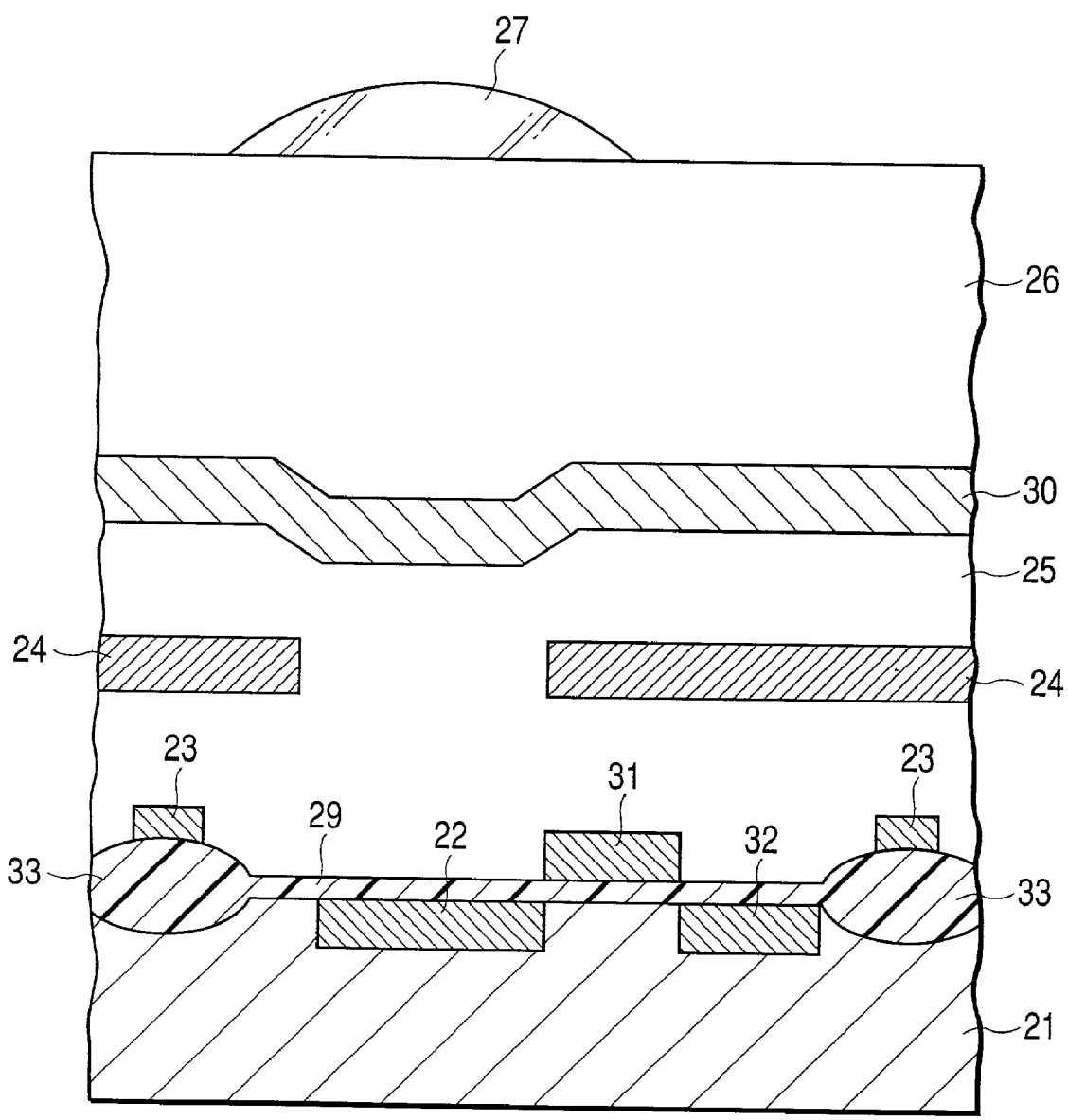
FIG. 6 is a sectional view showing peripheral portions of a photodiode and microlens of a conventional MOS image pickup element.

Pixel areas 2a to 2d serve to pick up an object image. In each pixel area, pixels are arranged two-dimensionally. Imaging systems (lenses) are provided for the respective pixel areas, which are designed to pick up the same object image (see FIG. 5 to be described later). Color filters (to be referred to as G filters hereinafter) 3a and 3c, each having the spectral transmission property of transmitting mainly green light, are formed in front of the pixel areas 2a and 2c. A color filter (to be referred to as a B filter hereinafter) 3b having the spectral transmission property of mainly transmitting blue light is formed in front of the pixel area 2b. A color filter (to be referred to as an R filter hereinafter) 3d having the spectral transmission property of mainly transmitting red light is formed in front of the pixel area 2d.

Different color signals are output from the respective pixel areas. A color image is formed by combining these signals.

An area 3 where the color filters are formed is formed in peripheral areas of the pixel areas (including the areas between the pixel areas) as well as in the pixel areas. One microlens is provided for each pixel. An area 4 where the microlenses are formed is formed in the areas between the pixel areas and in the peripheral areas of the pixel areas as well as in the pixel areas.

The above plurality of pixel areas 2a to 2d and their peripheral areas will be described in detail next with reference to FIG. 8.

A pixel 10 (to be described in detail later) includes a photoelectric conversion unit such as a photodiode. A signal is read from a pixel through a vertical signal line 11. A vertical scanning circuit 12, for example, resets and selects pixels on a line basis in the horizontal direction, and sequentially scans on a line basis in the vertical direction. A control line 13 is used to transfer a reset pulse, selection pulse, and the like from the vertical scanning circuit 12 to pixels. A load current source 14 forms a source follower together with a MOS transistor (to be described later) for amplifying and reading out a signal contained in a pixel. A holding capacitor 15 stores signals from pixels on one line. A transfer MOS transistor 16 serves to transfer a signal from a pixel to the holding capacitor. A transfer MOS transistor 17 transfers a signal from the holding capacitor to a horizontal signal line 18. A horizontal scanning circuit 19 controls the transfer MOS transmission to sequentially transfer signals from the holding capacitor to the horizontal signal line 18. An amplifier 20 amplifies and outputs a signal from a horizontal signal line. A reset MOS transistor 21 supplies a reset level to reset the horizontal signal line.

According to this embodiment, the distance between outermost pixels in adjacent pixel areas is set to be larger than the pitch of pixels in each pixel area.

Figure 8:
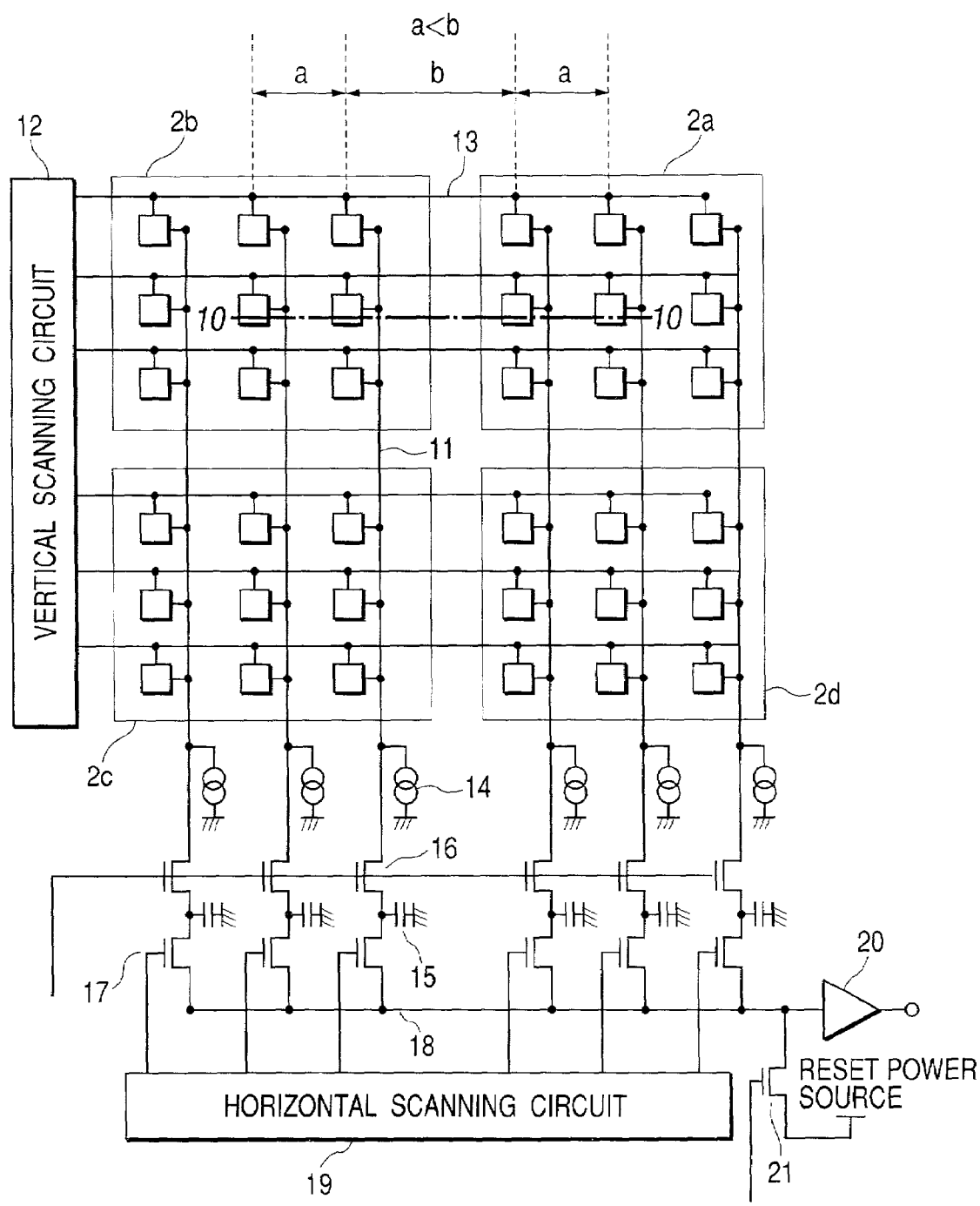
FIG. 8 is a circuit diagram showing the details of the solid-state image pickup element according to the first embodiment of the present invention.
Figure 9:
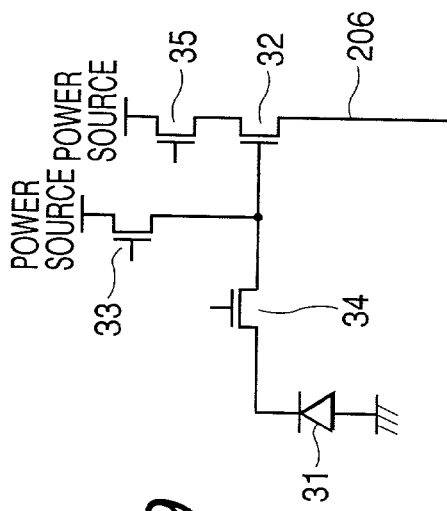
FIG. 9 is a view showing the details of a pixel included in the solid-state image pickup element according to the first embodiment of the present invention.

FIG. 9 is a view for explaining the pixel in FIG. 8 in detail.

This pixel includes a photoelectric conversion unit 31 such as a photodiode, a source follower input MOS transistor 32 for receiving a signal from the source follower input MOS transistor 32 through a gate electrode and outputting it from a source electrode upon amplifying it, a reset MOS transistor 33 for supplying a reset level to the gate electrode of the MOS transistor, a transfer MOS transistor 34 for transferring a signal from the photoelectric conversion unit 31 to the gate of the MOS transistor, and a selection MOS transistor 35 for applying a predetermined voltage to the drain of the MOS transistor so as to output to an output signal line a signal level corresponding to the signal level of the gate of the reset MOS transistor 33.

The operation of the solid-state image pickup element described with reference to FIG. 8 will be described next.

First of all, the pixels 10 in a plurality of pixel areas are reset on a line basis. Thereafter, signals are transferred from the photoelectric conversion units 31 included in the pixels 10 to the holding capacitors 15 on a line basis, and the signals stored in the holding capacitors 15 are sequentially read out to the horizontal signal line 18 by the horizontal scanning circuit 19.

As a result, a signal (R signal: the signal generated by an optical signal passing through a filter that mainly transmits red light) of one line of the pixel area 2d is read out from the amplifier 20 first. A signal (G signal: the signal generated by an optical signal passing through a filter that mainly transmits green light) of one line of the pixel area 2c is then read out. Subsequently, such operation is sequentially repeated.

After the above operation is repeated, a signal (G signal: the signal generated by an optical signal passing through a filter that mainly transmits green light) of one line of the pixel area 2a is read out from the amplifier 20 first. A signal (B signal: the signal generated by an optical signal passing through a filter that mainly transmits blue light) of one line of the pixel area 2b is read out next. Subsequently, such operation is sequentially repeated.

In the embodiment described above, an image pickup element is so arranged to include one vertical scanning circuit. However, the present invention is not limited to such the arrangement. Instead, one vertical scanning circuit may be arranged for the pixel areas 2a and 2b and another one verical scanning circuit may be arranged for the pixel areas 2c and 2d. According to this arrangement, the respective vertical scanning circuits can be scanned independently. In addition, by performing scanning in such a manner that a signal of first line of each of the pixel areas 2c and 2d is read out and subsequently, a signal of a first line of each of the pixel areas 2a and 2b is read out, difference among accumulation periods of photo-charges in the same lines of the respective pixel areas (first lines of the pixel areas 2a to 2d, for example) can be reduced and thus a higher quality image can be obtained.

On the other hand, two read-out portions each constructed by the elements 16 to 21 may be arranged on the side of the pixel areas 2a and 2b and on the side of the pixel areas 2c and 2d respectively, for example. This arrangement can also reduce the difference among accumulation periods of photo-charges in the same lines of the respective pixel areas (first lines of the pixel areas 2a to 2d, for example), thereby providing a higher quality image.

Figure 10:
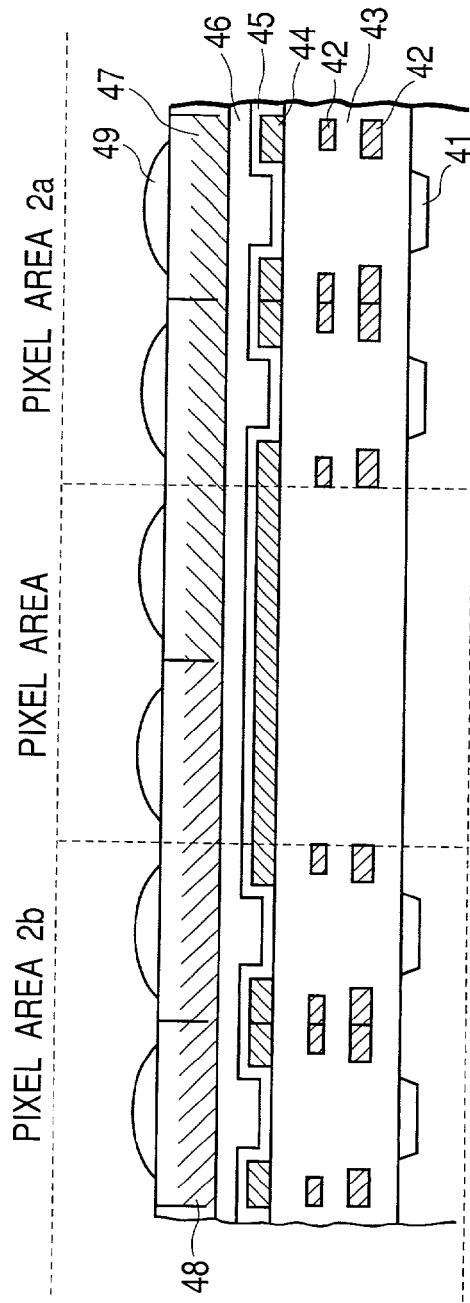
FIG. 10 is a sectional view of the solid-state image pickup element according to the first embodiment of the present invention.

FIG. 10 is a sectional view taken along a line of 10—10 in FIG. 8.

This portion includes a photoelectric conversion unit 41, interconnection layer 42, insulating layer 43, light-shielding layer 44, passivation layer 45, planarizing layer 46, G filter 47, R filter 48, and microlens 49.

As is obvious from FIG. 10, microlenses are formed in the peripheral area between the pixel area 2a and the pixel area 2b. These microlenses are formed for the following reasons.

A distance b between the pixel areas shown in FIG. 8 is larger than a pixel pitch a. If, however, the distance b excessively increases, the chip area of the solid-state image pickup element excessively increases. The distance b cannot therefore be increased much.

This formation of microlenses in the peripheral area prevents light having an incident angle intended for the pixel area 2b from striking the pixel area 2a. That is, with the formation of microlenses in the peripheral area, light incident on the peripheral area at the above incident angle is focused downward in the peripheral area. This makes it possible to prevent the light from entering the pixel area 2a.

In addition, the formation of color filters and microlenses in the peripheral area prevents the nonuniformity of the shapes of the color filters and the boundary portions between the color filters from affecting the pixel areas, thus preventing a deterioration in sensitivity and sensitivity irregularity.

Figure 11:
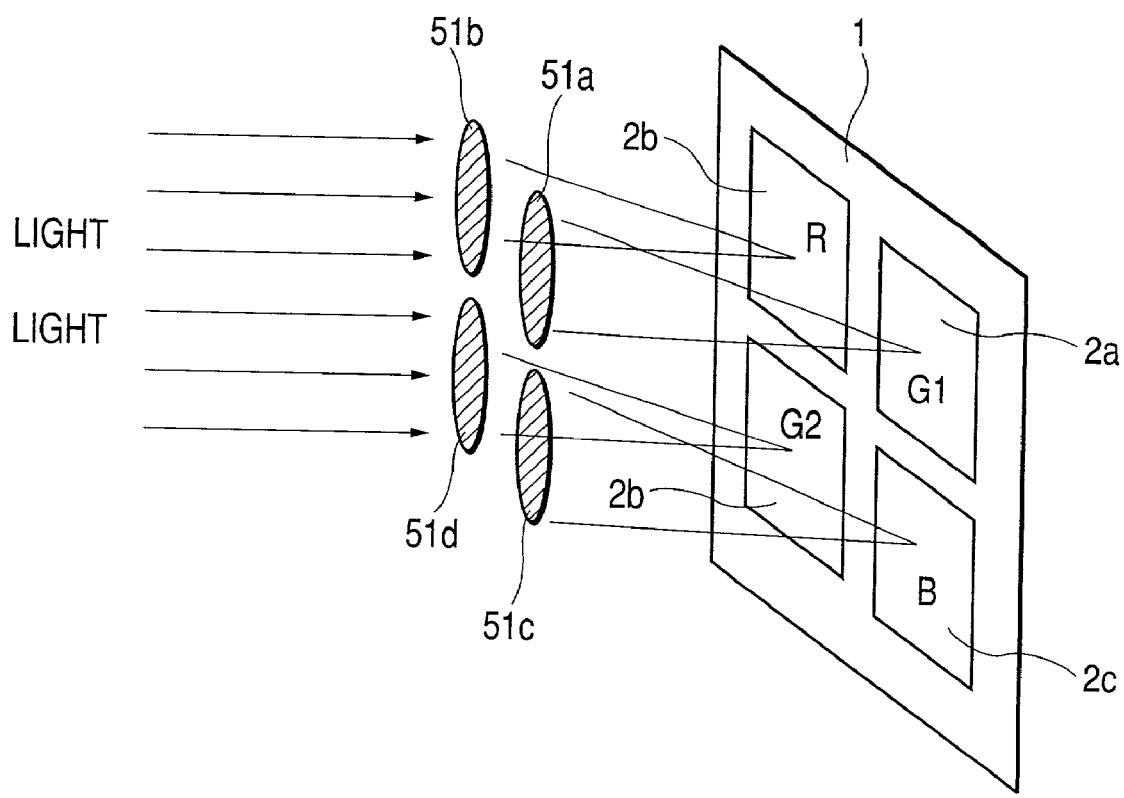
FIG. 11 is a view showing the solid-state image pickup element and lenses according to the first embodiment of the present invention.

FIG. 11 is a view showing the relationship between the above solid-state image pickup element and lenses for forming light from an object into an image on the solid-state image pickup element.

A lens 51a is used to form an object image in the pixel area 2a. A lens 51b is used to form an object image in the pixel area 2b. A lens 51c is used to form an object image in the pixel area 2c. A lens 51d is used to form an object image in the pixel area 2d.

As described above, according to this embodiment, an object image is divided into a plurality of object images, which are picked up in the respective pixel areas. For this reason, each pixel area in this embodiment is smaller than the pixel area of a solid-state image pickup element having a conventional arrangement, and the focal length of each lens can be decreased. This makes it possible to form an image pickup apparatus such as a digital camera with reduced thickness.

The above embodiment has exemplified the structure of a pixel. However, another arrangement may be used. For example, an arrangement using elements other than MOS transistors may be used.

In addition, a CCD may be used in place of the above CMOS sensor.

In this embodiment, areas where microlenses and color filters are formed are identical to each other. However, they need not be identical.

Color filters are not limited to the on-chip filters described above, and may be arranged separately from the semiconductor chip. The arrangement of color filters is not limited to that descried above. For example, complementary color filters may be used.

The above pixel areas have no optical black pixels. However, each pixel area may include optical black pixels.

This embodiment has exemplified the arrangement having four pixel areas. However, a solid-state image pickup element may have three pixel areas, namely a pixel area for a G filter, a pixel area for a B filter, and a pixel area for an R filter.

Figure 12:
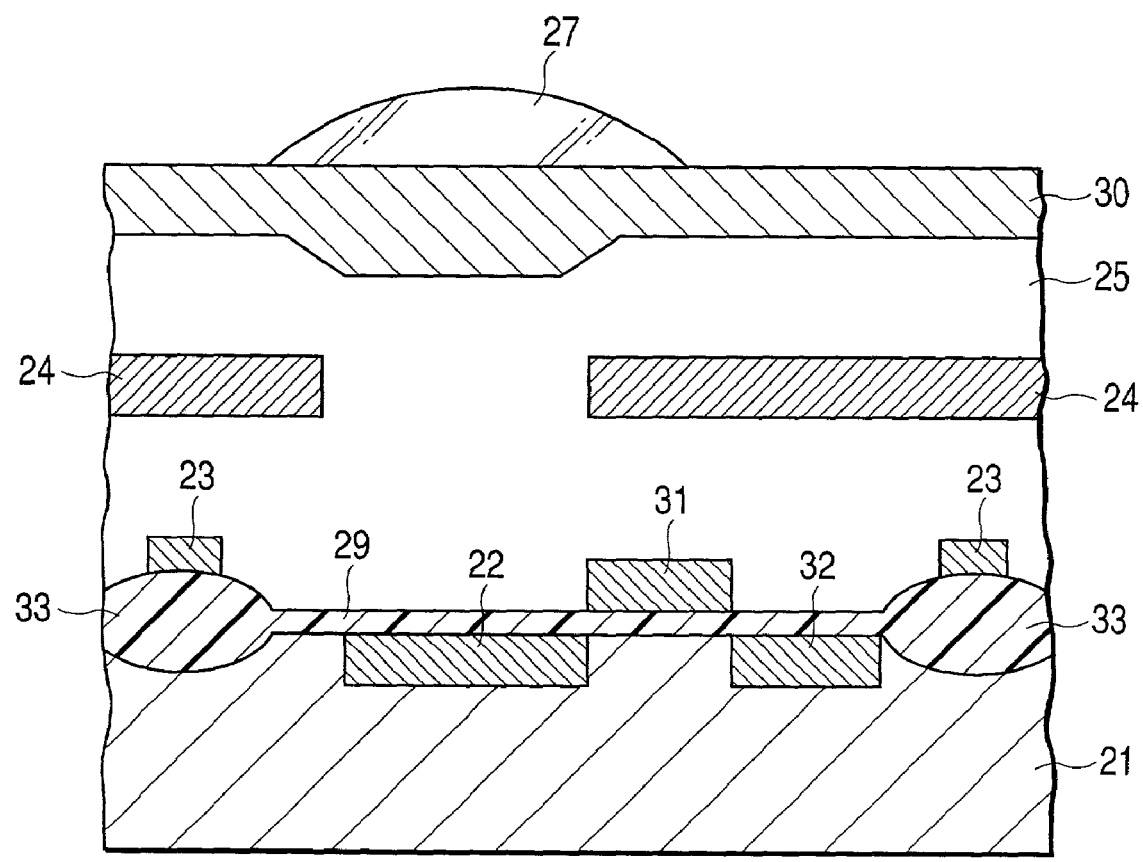
FIG. 12 is a view showing peripheral portions of a photodiode and microlens of a solid-state image pickup element according to the second embodiment of the present invention.

FIG. 12 is a sectional view showing peripheral portions of a photoelectric conversion unit such as a photodiode and microlens of a solid-state image pickup element according to the second embodiment of the present invention. The structure shown in FIG. 12 includes a substrate 21 made of silicon or the like, a photodiode 22 formed on the substrate 21, a floating diffusion area 32 serving as a transfer destination of the charge converted by the photodiode 22, a transfer gate 31 for controlling the charge converted by the photodiode 22, a selective oxide layer 33 for isolation from an adjacent MOS image pickup element, an oxide layer 29 formed on the substrate 21, an interconnection 23 made of polysilicon or aluminum and serving to transmit the charge converted by the photodiode 22 or the like, a light-shielding layer 24 made of aluminum or the like to shield a transistor against light, shielding the floating diffusion area 32, the selective oxide layer 33, a first passivation layer 25 made of inorganic material (inorganic compound) such as $SiO_2$ and serving to protect the photodiode 22 and the like against mainly the outside air, moisture, and impurity ions (impurity contaminants such as $K^+$, $Na^+$, and $H_2O$), a second passivation layer 30 made of an inorganic material (inorganic compound) such as SiN or SiON and serving as a passivation layer, and a microlens 27 formed on the second passivation layer 30 to focus light from an object onto the photodiode 22.

The solid-state image pickup element shown in FIG. 12 has the light-shielding layer 24 to prevent light from striking the floating diffusion area 32, selective oxide layer 33, and MOS transistor. If, therefore, the first passivation layer 25 is formed on the light-shielding layer 24, recesses/projections with a level difference of about 7000 Å are formed on the light-shielding layer 24.

To place the microlens 27 on a flat surface, the second passivation layer 30 having a flat upper surface is formed. More specifically, the upper surface of the first passivation layer 25 is coated with an SiON-based material, and the resultant surface is planarized by CMP (Chemical Mechanical Polish), thereby forming the second passivation layer 30 having a thickness of about 2,000 Å from a projection of the first passivation layer 25 and a thickness of about 9,000 Å from a recess of the first passivation layer 25.

Figure 1:
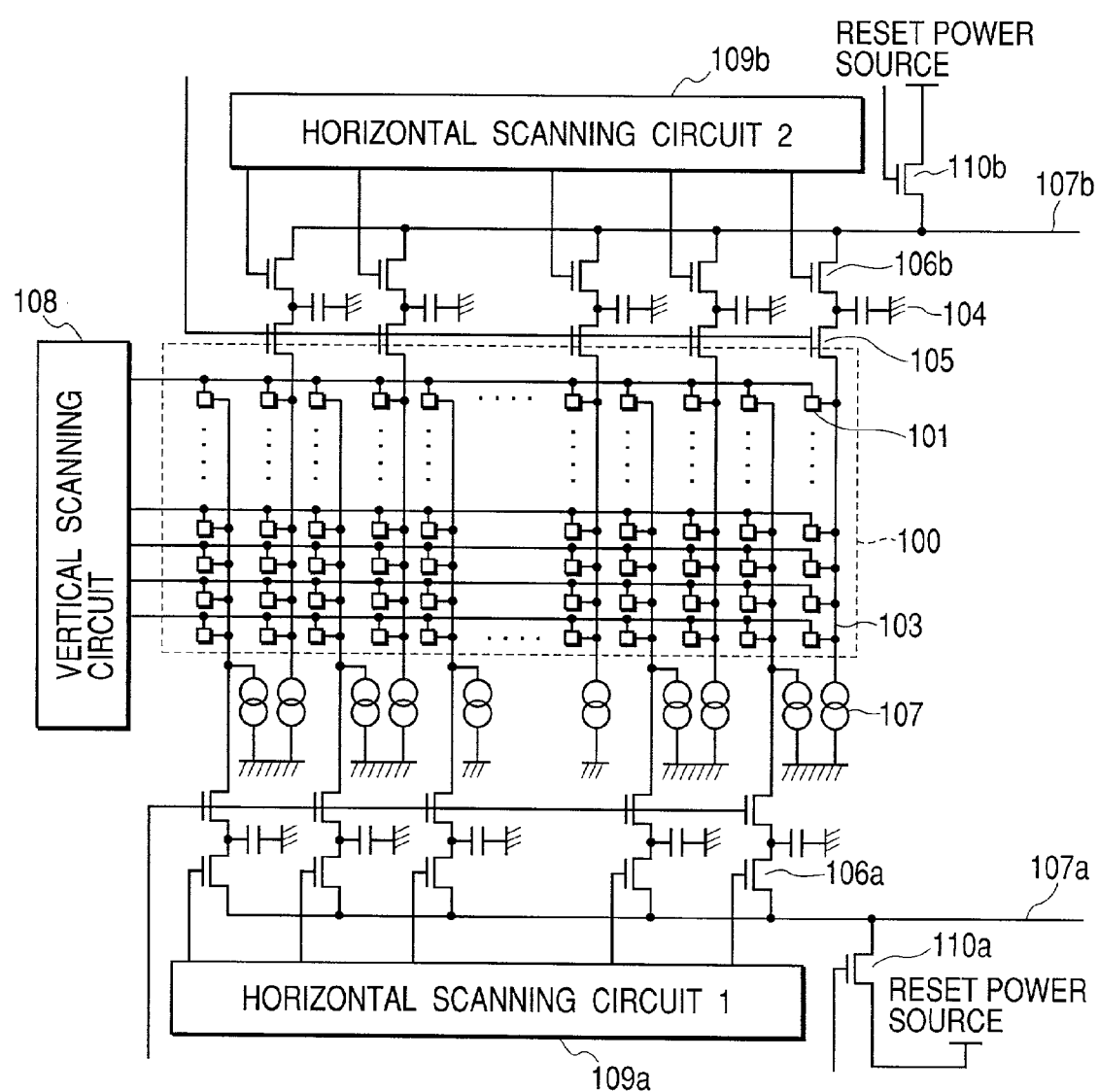
FIG. 1 is a view showing the details of a conventional solid-state image pickup element.
Figure 2:
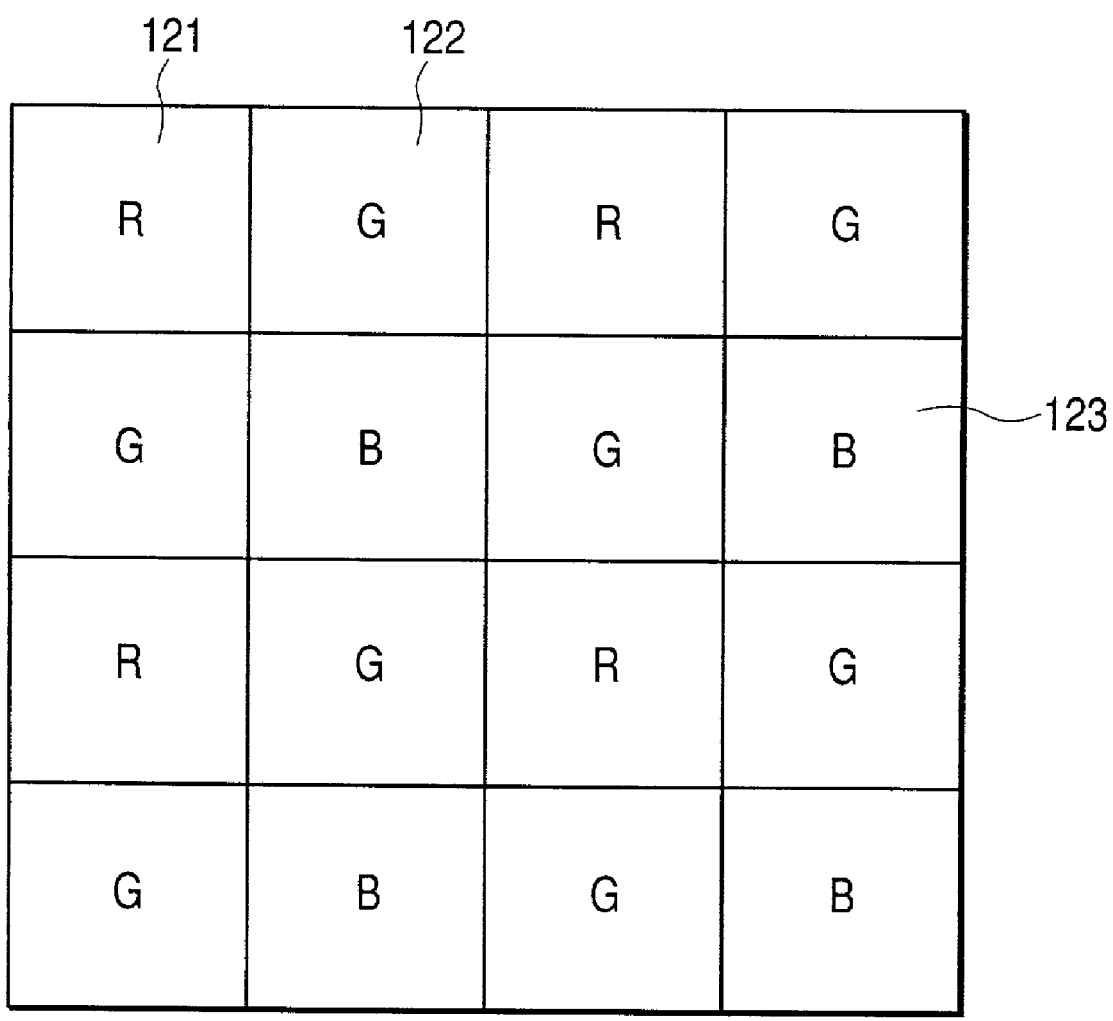
FIG. 2 is a view showing a conventional arrangement of color filters.
Figure 3:
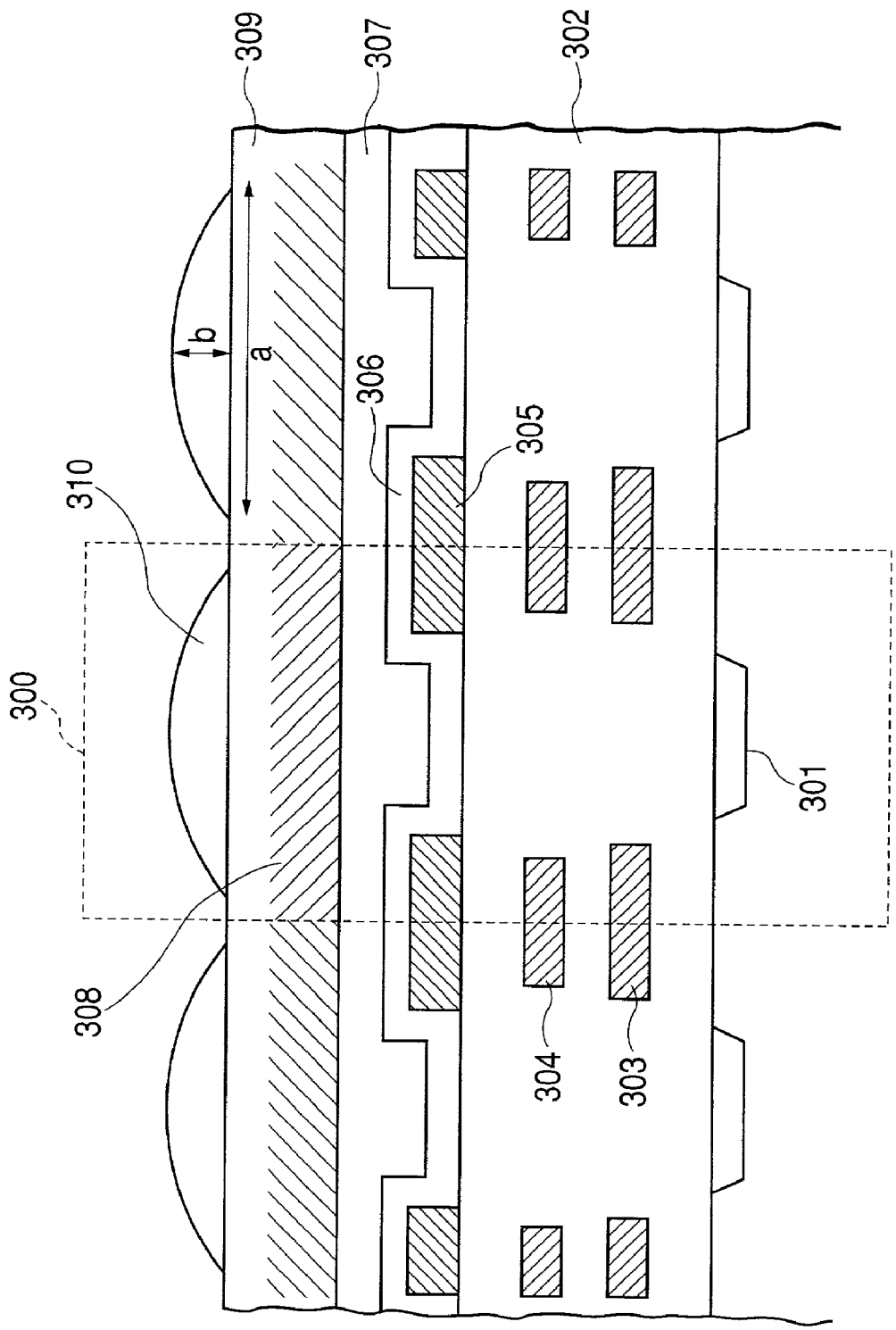
FIG. 3 is a sectional view showing a conventional solid-state image pickup element.
Figure 4:
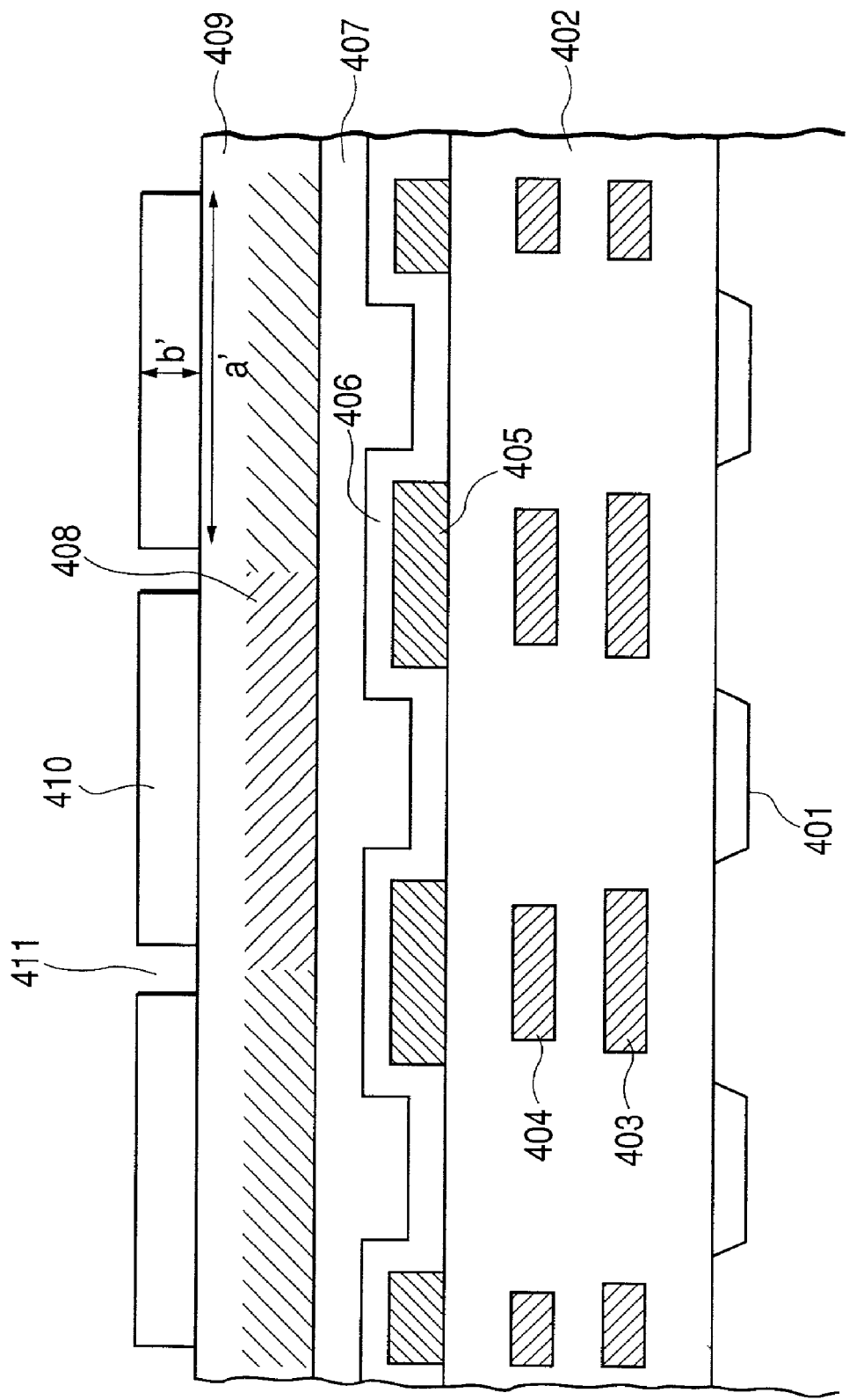
FIG. 4 is a sectional view of a conventional solid-state image pickup element.

The distance from the upper surface of the second passivation layer 30 formed in this manner to the upper surface of the photodiode 22 is about 2.5 to 3.5 μm. The microlens 27 is then formed on the second passivation layer 30 to manufacture a solid-state image pickup apparatus like the one shown in FIG. 1.

As described above, according to this embodiment, since the second passivation layer 30 is made of an SiO-based material, this layer is planarized by CMP to focus obliquely-incident light onto the photodiode 22 without forming any planarizing layer.

Figure 13:
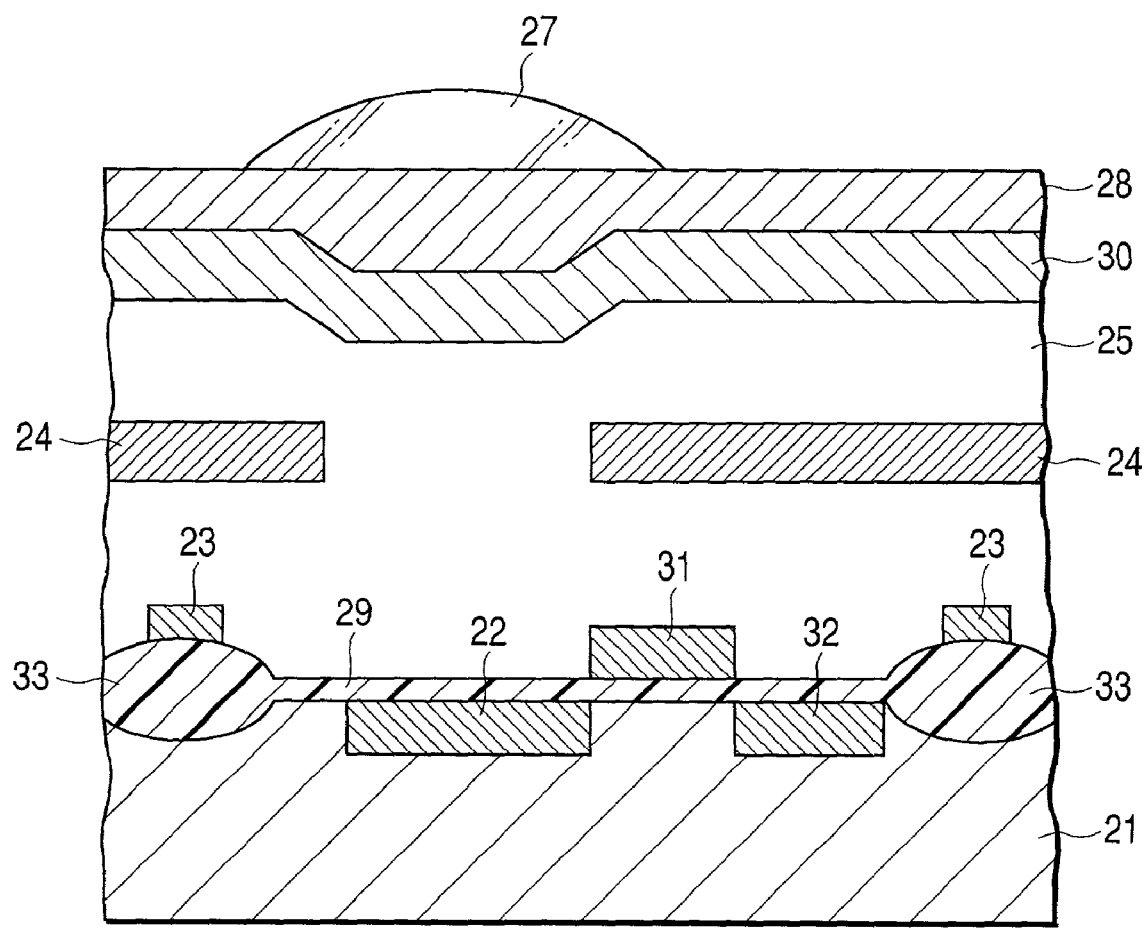
FIG. 13 is a view showing peripheral portions of a photodiode and microlens of a solid-state image pickup element according to the third embodiment of the present invention.

FIG. 13 is a sectional view showing peripheral portions of the photodiode and microlens of a solid-state image pickup element according to the third embodiment of the present invention. Referring to FIG. 13, a third passivation layer 28 is made of an inorganic material (inorganic compound) such as an SiO-based material. The same reference numerals as in FIG. 12 denote the same parts in FIG. 13.

According to the solid-state image pickup element shown in FIG. 13, like the element shown in FIG. 12, a first passivation layer 25 is formed first, and then a second passivation layer 30 having, for example, a thickness of about 2,000 Å is formed on the first passivation layer 25. The third passivation layer 28 is formed on the second passivation layer 30. More specifically, the upper surface of the second passivation layer 30 is coated with an SiON-based material, and the resultant surface is planarized by CMP, thereby forming the third passivation layer 28 having a thickness of about 2,000 Å from a projection of the second passivation layer 30 and a thickness of about 9,000 Å from a recess of the second passivation layer 30.

The distance from the upper surface of the third passivation layer 28 formed in this manner to the upper surface of a photodiode 22 is about 2.7 to 3.7 μm. A microlens 27 is then formed on the third passivation layer 28, thus forming a solid-state image pickup element like the one shown in FIG. 13.

As described above, according to this embodiment, by forming the third passivation layer 28 by CMP, light obliquely incident on the solid-state image pickup element having the photodiode 22 length of whose side is about 1.5 μm, is focused on the photodiode 22.

In practice, the SiON- or SiO-based materials used in the first and second embodiments include $Si_3N_4$, $SiO_2$, plasma SiON, plasma SiN, plasma SiO, and the like.

Figure 14:
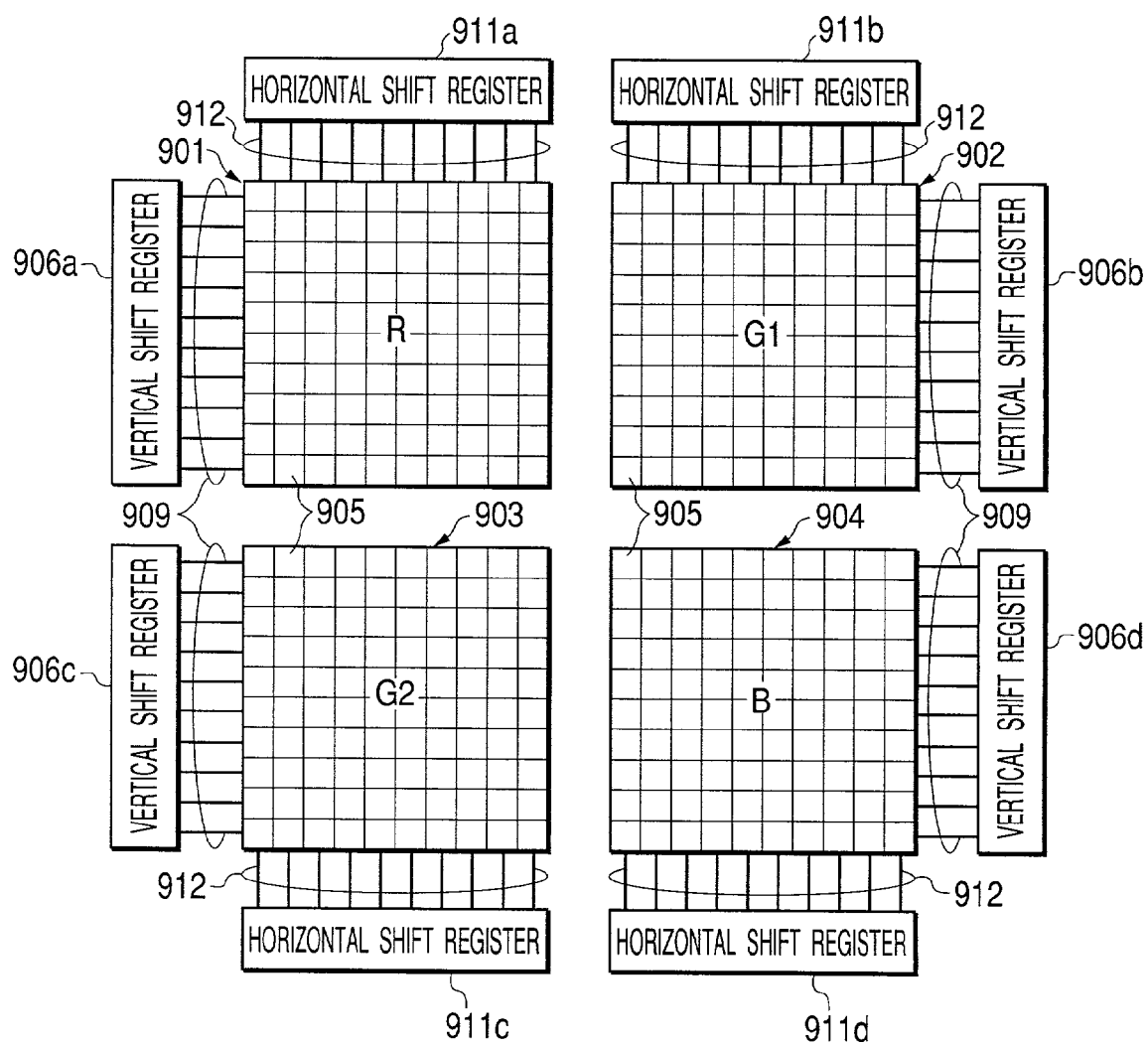
FIG. 14 is an image pickup apparatus using a solid-state image pickup element according to the fourth embodiment of the present invention.

FIG. 14 is a schematic view showing a solid-state image pickup element according to the fourth embodiment, which has an arrangement especially effective for the solid-state image pickup elements according to the second and third embodiments. The solid-state image pickup element shown in FIG. 14 is formed on a single semiconductor chip.

Referring to FIG. 14, this element includes pixels 905 having photoelectric conversion units and image pickup areas 901 to 904, i.e., R, G1, G2, and B image pickup areas, in which the pixels 905 are arranged two-dimensionally and onto which images are formed. The four image pickup areas 901 to 904 are arranged two-dimensionally. FIG. 11 shows the positional relationship between the lenses and the solid-state image pickup element.

Referring to FIG. 14, vertical shift registers 906a to 906d control the timings at which control signals are supplied to the respective pixels 905 arranged in the respective image pickup areas 901 to 904 to read out amplified signals based on charge from the respective pixels 905. A horizontal signal line 909 serves to supply a control signal to each pixel 905. A vertical signal line 912 serves to transmit an amplified signal read out from each pixel 905. Horizontal shift registers 911a to 911d control sequential transfer of amplified signals, read out to the vertical signal lines 912 of the respective image pickup areas 901 to 904, to an external processing circuit.

Note that the R, G1, B, and G2 image pickup areas 901 to 904 are optically designed such that, for example, the R image pickup area 901 having an R filter and the B image pickup area 904 having a B filter are arranged diagonally, and the G1 image pickup area 902 having a G1 filter and the G2 image pickup area 903 having a G2 filter are arranged diagonally.

Figure 15:
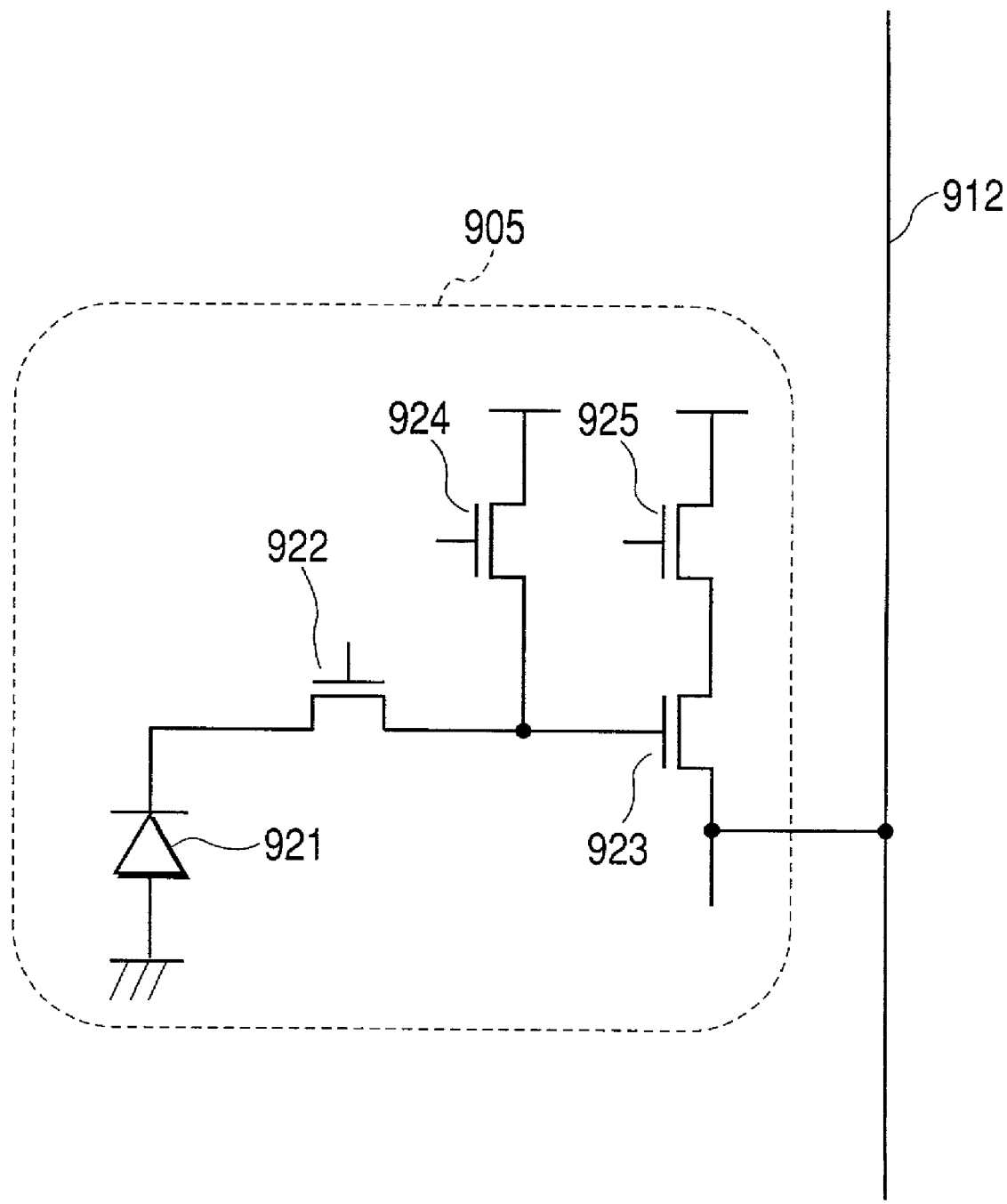
FIG. 15 is an equivalent circuit diagram of one pixel of the solid-state image pickup element in FIG. 14.

FIG. 15 is an equivalent circuit diagram showing the arrangement of each pixel 905. FIGS. 12 and 13 are sectional views of each pixel 905. Referring to FIG. 15, a photodiode (photoelectric conversion unit) 921 photoelectrically converts incident light. A transfer switch 922 transfers an electrical signal to the floating diffusion area. A reset switch 924 resets the charge in the floating diffusion area. A MOS transistor 923 is used to obtain an amplified signal. A selection switch 925 is used to selectively read out an amplified signal from the MOS transistor.

The above transfer switch, reset switch, MOS transistor, and selection switch are controlled by signals supplied from the vertical shift register 906.

The operations of the arrangements shown in FIGS. 14 and 15 will be described next. First of all, an object image is divided into four images by an image pickup lens, which are then focused onto the respective image pickup areas 901 to 904. When light is incident on the respective photodiodes 921 arranged at the corresponding positions in the respective image pickup areas 901 to 904, charge is generated. when each transfer switch 922 is turned on, the charge in each photodiode 921 is transferred to each floating diffusion area. With this operation, the gate of each MOS transistor 923 is turned on by the charge.

When the gates of the selection switches 925 with which reading of amplified signals is selected are turned on by control signals from the vertical shift registers 906a to 906d through the respective horizontal signal lines 909, the amplified signals obtained by the MOS transistors 923 are read out to the respective vertical signal lines 912. Note that in each pixel 905 from which an amplified signal has been read out, the reset switch 924 is turned on to reset the potentials of the floating diffusion area and photodiode 921.

The amplified signals read out to the respective vertical signal lines 912 are sequentially transferred to a processing circuit (not shown) under the control of the respective horizontal shift registers 911 in the order of, for example, the pixels 905 in the R image pickup area 901, the pixels in G1 image pickup area 902, the pixels in B image pickup area 904, and the pixels in G2 image pickup area 903.

As shown in FIG. 14, the solid-state image pickup element according to this embodiment has the vertical shift registers 906a to 906d and horizontal shift registers 911a to 911d provided for the respective image pickup areas 901 to 904. In this arrangement, control signals are simultaneously supplied from the vertical shift registers 906a to 906d to the pixels 905 at corresponding positions, and amplified signals read out from the respective pixels 905 are transferred to the processing circuit through the horizontal shift registers 911a to 911d. In this embodiment, the color filters respectively formed in the image pickup areas 901 to 904 are located above the microlenses (closer to the light incident side than the microlenses), and are arranged separately from the semiconductor chip on which the microlenses are formed.

As described above, according to the second to fourth embodiments, since the microlenses are formed in contact with the planarized passivation layer, the distance between each microlens and a corresponding photodiode can be reduced. This makes is possible to prevent a deterioration in the photosensitivity of the photodiode and the occurrence of light shading.

Figure 16:
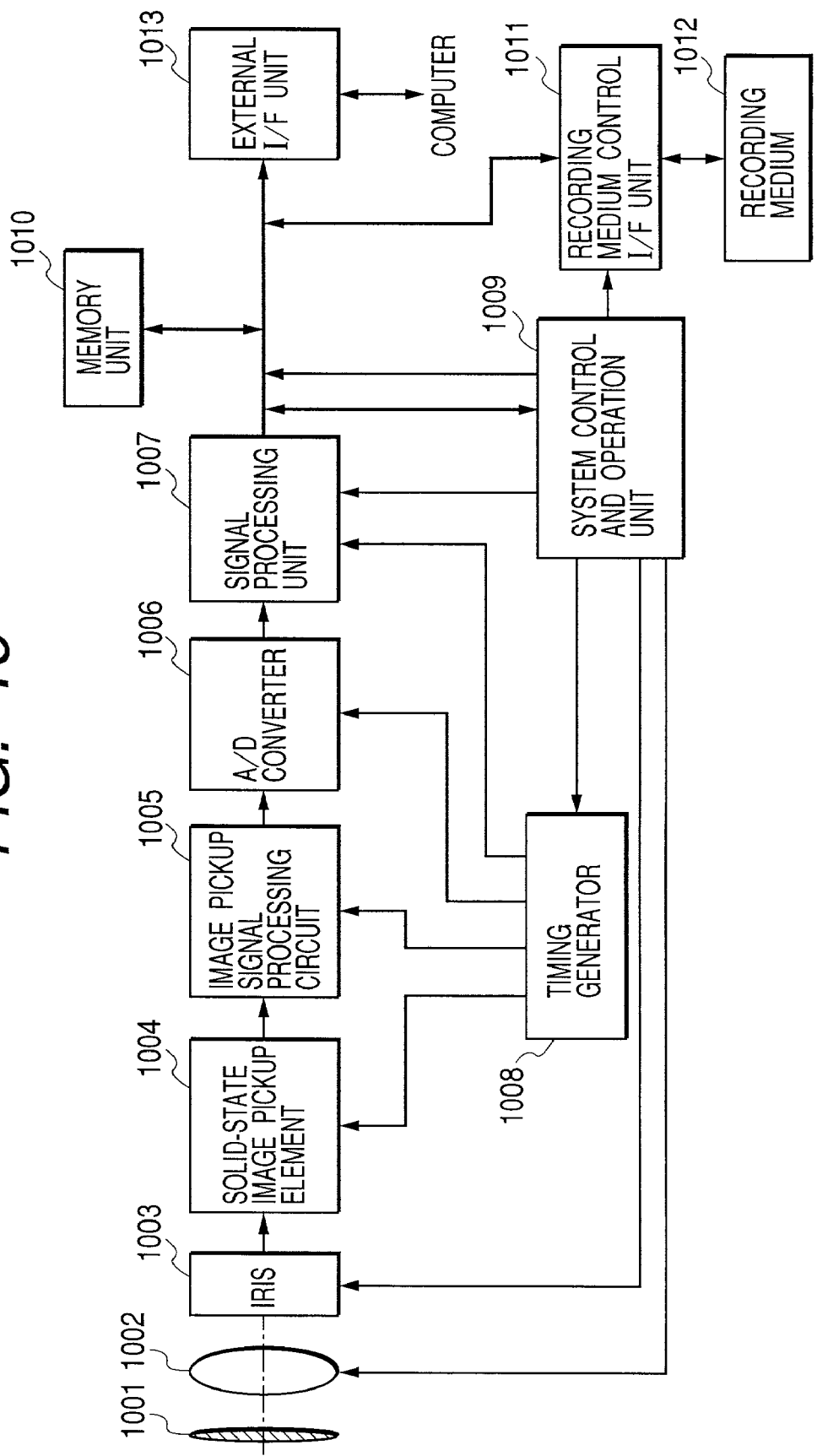
FIG. 16 is a block diagram showing the arrangement of an image pickup apparatus according to the fifth embodiment of the present invention.

FIG. 16 is a block diagram showing the arrangement of an image pickup apparatus as the fifth embodiment using one of the solid-state image pickup elements according to the first to fourth embodiments. Referring to FIG. 16, a barrier 1001 protects a lens and serves as a main switch. A lens 1002 (corresponding to the lenses 51a to 51d in FIG. 11 according to the first and fourth embodiments) serves to form an optical image of an object on a solid-state image pickup element 1004. An iris 1003 changes the amount of light passing through the lens. A solid-state image pickup element 1004 receives the object image formed by the lens 1002 and outputs an image signal. An image pickup signal processing circuit 1005 performs processing such as various types of corrections and clamping for the image signal output from the solid-state image pickup element 1004. An A/D converter 1006 performs analog/digital conversion of the image signal output from the solid-state image pickup element 1004. A signal processing unit 1007 performs various types of corrections for the image data output from the A/D converter 1006 and compresses the data. A timing generator 1008 outputs various timing signals to the solid-state image pickup element 1004, image pickup signal processing circuit 1005, A/D converter 1006, and signal processing unit 1007. A system control and operation unit 1009 controls various computations and an overall still/video camera. A memory unit 1010 temporarily stores image data. A recording medium control I/F unit 1011 is used to record data on a recording medium or read out data therefrom. A detachable recording medium 1012 is a semiconductor memory or the like on/from which data is recorded/read out. An external interface (I/F) unit 1013 serves to communicate with an external computer or the like.

The operation of the apparatus in FIG. 16 will be described next. When the barrier 1001 is opened, the main power source is turned on, and the power source of the control system is then turned on. The power source of the image pickup circuit such as the A/D converter 1006 is also turned on. To control the exposure amount, the system control and operation unit 1009 opens the iris 1003, and a signal output from the solid-state image pickup element 1004 is output to the A/D converter 1006 through the image pickup signal processing circuit 1005. The A/D converter 1006 A/D-converts the signal and outputs the resultant data to the signal processing unit 1007. The signal processing unit 1007 computes an exposure amount on the basis of the data by using the system control and operation unit 1009.

Brightness is determined on the basis of the result of this photometry, and the system control and operation unit 1009 controls the iris in accordance with the result. The system control and operation unit 1009 computes the distance to the object by extracting a high-frequency component from the signal output from the solid-state image pickup element 1004. Thereafter, the lens is driven and it is checked whether the lens is in focus. If it is determined that the lens is out of focus, the lens is driven again and distance measuring is performed again.

After an in-focus state is confirmed, exposure is started. After the exposure is completed, the image signal output from the solid-state image pickup element 1004 is subjected to correction and the like in the image pickup signal processing circuit 1005 and A/D-converted by the A/D converter 1006. The system control and operation unit 1009 stores the resultant data in the memory unit 1010 through the signal processing unit 1007. Thereafter, the data stored in the memory unit 1010 is recorded on the detachable recording medium 1012 such as a semiconductor memory through the recording medium control I/F unit 1011 under the control of the system control and operation unit 1009. This data may be directly input to a computer or the like through the external I/F unit 1013 to be subjected to image processing.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:
   a plurality of pixel areas arranged on a single semiconductor chip to be adjacent to each other through a predetermined space, each of said pixel areas having pixels arranged two-dimensionally, each of the pixels having a photoelectric conversion unit; and
   a plurality of microlenses for forming light into images, wherein said plurality of microlenses are arranged on said plurality of pixel areas corresponding to each of the pixels and arranged on the predetermined spaces between said plurality of pixel areas,
   wherein light incident on the predetermined spaces is focused downward in the predetermined spaces by said microlenses arranged on the predetermined spaces, and
   wherein light incident on said pixel areas is focused downward to the photoelectric conversion units by said microlenses arranged on said plurality of pixel areas.

2. An apparatus according to claim 1, further comprising a scanning circuit adapted to select a pixel included in the pixel area, said scanning circuit being formed on the semiconductor chip on a side on which the pixel area is not adjacent to the other pixel areas.

3. An apparatus according to claim 1, wherein said plurality of pixel areas comprise at least first, second, and third pixel areas, said first pixel area receiving a first color component from an object, said second pixel area receiving a second color component from the object, and said third pixel area receiving a third color component from the object.

4. An apparatus according to claim 3, wherein the first color component is a red component, the second color component is a green component, and the third color component is a blue component.

5. An apparatus according to claim 1, further comprising a plurality of lenses for forming light into images, said lenses being provided corresponding to said respective pixel areas.

6. An apparatus according to claim 1, further comprising;
   a signal processing unit adapted to form an image by synthesizing signals respectively output from said plurality of pixel areas;
   a timing generator adapted to drive said plurality of pixel areas and said signal processing unit; and
   a control and operation unit adapted to control said signal processing unit and said timing generator.

* * * * *

UNITED STATES PATENT AND TRADEMARK OFFICE
CERTIFICATE OF CORRECTION

| | | |
|---|---|---|
| PATENT NO. | : 7,139,028 B2 | Page 1 of 2 |
| APPLICATION NO. | : 09/976096 | |
| DATED | : November 21, 2006 | |
| INVENTOR(S) | : Itano et al. | |

It is certified that error appears in the above-identified patent and that said Letters Patent is hereby corrected as shown below:

ON THE TITLE PAGE, AT ITEM (57), Abstract:
Line 6, "pixels" should read --pixel--.

COLUMN 1:
Line 44, "not be" should read --not to be--.
Line 52, "FIG. 1" should read --FIG. 1)--.

COLUMN 2:
Line 34, "formed blow" should read --formed below--.
Line 51, "Subsequently," should begin a new paragraph.

COLUMN 3:
Line 23, "some case." should read --some cases.--.
Line 55, "pixels" should read --pixel--.

COLUMN 6:
Line 24, "the arrangement." should read --an arrangement.--.
Line 25, "another one" should read --another--.
Line 30, "first" should read --a first--.

COLUMN 7:
Line 34, "descried" should read --described--.

COLUMN 8:
Line 57, "length" should read --the length--.

COLUMN 9:
Line 47, "when" should read --When--.

UNITED STATES PATENT AND TRADEMARK OFFICE
CERTIFICATE OF CORRECTION

PATENT NO. : 7,139,028 B2
APPLICATION NO. : 09/976096
DATED : November 21, 2006
INVENTOR(S) : Itano et al.

It is certified that error appears in the above-identified patent and that said Letters Patent is hereby corrected as shown below:

COLUMN 10:
Line 19, "makes is" should read --makes it--.

Signed and Sealed this

Twelfth Day of August, 2008

JON W. DUDAS
*Director of the United States Patent and Trademark Office*